(12) United States Patent
Habu et al.

(10) Patent No.: US 11,855,614 B2
(45) Date of Patent: Dec. 26, 2023

(54) SEMICONDUCTOR DEVICE

(71) Applicant: Mitsubishi Electric Corporation, Tokyo (JP)

(72) Inventors: Yo Habu, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/465,349

(22) Filed: Sep. 2, 2021

(65) Prior Publication Data
US 2022/0173730 A1 Jun. 2, 2022

(30) Foreign Application Priority Data
Nov. 30, 2020 (JP) .................................. 2020-198494

(51) Int. Cl.
*H03K 17/08* (2006.01)
*H03K 17/081* (2006.01)
*H03K 17/30* (2006.01)

(52) U.S. Cl.
CPC ..... *H03K 17/08104* (2013.01); *H03K 17/302* (2013.01); *H03K 2217/0027* (2013.01)

(58) Field of Classification Search
None
See application file for complete search history.

(56) References Cited

U.S. PATENT DOCUMENTS

| | | | |
|---|---|---|---|
| 10,270,392 B1* | 4/2019 | Lai | H03F 3/4521 |
| 2007/0200590 A1* | 8/2007 | Lalithambika | G01R 19/0092 |
| | | | 324/133 |
| 2008/0013233 A1* | 1/2008 | Otake | H01L 27/0266 |
| | | | 361/56 |
| 2013/0077359 A1* | 3/2013 | Lindemann | H02M 1/44 |
| | | | 363/39 |
| 2013/0141946 A1* | 6/2013 | Sakurai | H02M 3/33523 |
| | | | 363/21.16 |
| 2018/0198442 A1 | 7/2018 | Hokazono et al. | |
| 2018/0284164 A1* | 10/2018 | Sakaguchi | G01R 19/16538 |
| 2019/0334341 A1* | 10/2019 | Effing | H02H 7/1203 |

FOREIGN PATENT DOCUMENTS

WO 2017/104077 A1 6/2017

* cited by examiner

*Primary Examiner* — Daniel C Puentes
(74) *Attorney, Agent, or Firm* — Studebaker & Brackett PC

(57) ABSTRACT

During an ON period of a high breakdown voltage switch provided within an ON period of a semiconductor switching element, a detection circuit outputs to a predetermined node a voltage obtained by dividing an inter-terminal voltage by a plurality of resistor elements. A voltage comparison circuit outputs a detection signal indicating whether or not the inter-terminal voltage is greater than a predetermined determination voltage based on a comparison between the voltage of the predetermined node and a predetermined DC voltage. The high breakdown voltage switch has a breakdown voltage greater than a potential difference between a high potential and a low potential during an OFF period.

8 Claims, 7 Drawing Sheets

SEMICONDUCTOR DEVICE

BACKGROUND OF THE INVENTION

Field of the Invention

The present disclosure relates to a semiconductor device.

Description of the Background Art

It is known that when an overcurrent is generated in a semiconductor switching element, a voltage abnormality called a desaturation status occurs in which a voltage between a positive electrode and a negative electrode (an inter-terminal voltage) rises even though the switching element is in an ON state.

WO 2017/104077 discloses the configuration of a driving circuit which has a function of detecting desaturation of an inter-terminal voltage of a semiconductor switching element. In the configuration disclosed by WO 2017/104077, a diode and a capacitor are connected between a desaturation detection terminal of an IC (Integrated Circuit) and a positive electrode and a negative electrode of the semiconductor switching element. Further, the IC is provided with a constant current source connected to the desaturation detection terminal and a comparator configured to compare a voltage of the desaturation detection terminal with a threshold voltage.

In the driving circuit disclosed by WO 2017/104077, when the semiconductor switching element is normal, i.e., without the occurrence of a desaturation status, the desaturation detection terminal is clamped to the saturation voltage of the semiconductor switching element due to the conduction of the diode. On the other hand, when a desaturation status occurs, the diode becomes non-conductive, the capacitor is charged by the current from the constant current source, whereby the voltage of the desaturation detection terminal increases. Therefore, a desaturation voltage is detected to occur in the semiconductor switching element based on the changes in the output level of the comparator.

SUMMARY OF THE INVENTION

However, according to the configuration disclosed by WO 2017/104077, when the semiconductor switch is turned off, the voltage applied to the positive electrode of the semiconductor switching element is applied to the cathode of a diode, in order to ensure insulation, it is necessary that the diode is a high breakdown voltage diode. Whether the diode is arranged inside or outside the IC, it is concerned to increase the circuit scale.

Further, since the current supplied from the constant current source is continued even during the OFF period of the semiconductor switching element, it is concerned to increase the power consumption of the IC so as to detect the desaturation status.

The present disclosure has been made to solve the problems mentioned above, and an object of the present disclosure is to provide a configuration for detecting an abnormality in an inter-terminal voltage between a positive electrode and a negative electrode when a semiconductor switching element is turned on, without increasing power consumption and circuit scale.

According to an aspect of the present disclosure, a semiconductor device includes a detection circuit connected between a positive electrode and a negative electrode of a semiconductor switching element, and a detection voltage generation circuit. The detection circuit includes a switch, a first resistor element having a first electric resistance value, and a second resistor element having a second electric resistance value. The switch and the first resistive element are connected in series between the positive electrode and the first node. The second resistive element is connected between the first node and the negative electrode. At least one of the first resistor element and the second resistor element is a variable resistor element. The positive electrode is connected to a node that supplies a first potential via another semiconductor switching element, and the negative electrode is connected to a node that supplies a second potential lower than the first potential. The detection voltage generation circuit outputs a voltage signal having a voltage dependent on an inter-terminal voltage between the positive electrode and the negative electrode based on a voltage of the first node during an ON period of the switch provided within an ON period of the semiconductor switching element. The switch has a breakdown voltage greater than at least a potential difference between the first potential and the second potential during an OFF period.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
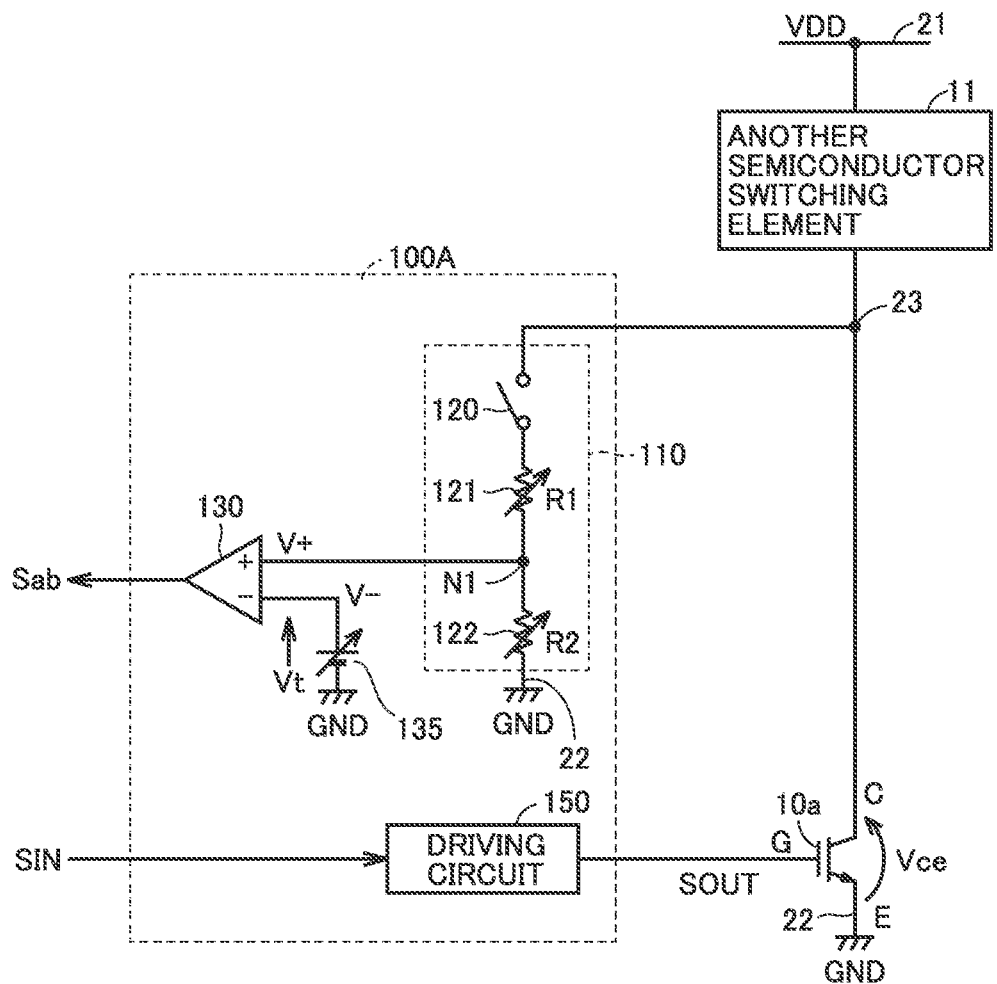
FIG. 1 is a first circuit diagram illustrating the configuration of a semiconductor device according to a first embodiment.

Hereinafter, embodiments of the present disclosure will be described in detail with reference to the drawings. In the following description, the same or corresponding portions in the drawings are denoted by the same reference numerals, and the description thereof will not be repeated.

First Embodiment

FIG. 1 is a circuit diagram illustrating the configuration of a semiconductor device according to a first embodiment.

As illustrated in FIG. 1, a semiconductor device 100A according to the first embodiment functions as a driving IC for a semiconductor switching element 10a. The semiconductor switching element 10a, which is turned on and off by the semiconductor device 100A, is typically constituted by an IGBT (Insulated Gate Bipolar Transistor). The semiconductor switching element 10a includes a collector (C) corresponding to a "positive electrode", an emitter (E) corresponding to a "negative electrode", and a gate (G) corresponding to a "control electrode". A collector-emitter voltage Vce of the semiconductor switching element 10a corresponds to an "inter-terminal voltage". Hereinafter, the collector-emitter voltage Vce is also referred to as the inter-terminal voltage Vce.

The semiconductor switching element 10a is connected between an intermediate potential node 23 and a low potential node 22 to which a low potential GND is supplied. The intermediate potential node 23 is connected via another semiconductor switching element 11 to a high potential node 21 to which a high potential VDD is supplied. In other words, the semiconductor switching element 10a of FIG. 1 and the other semiconductor switching elements are connected in series between the high potential node 21 and the low potential node 22 to form a so-called "lower arm" and an "upper arm".

When the other semiconductor switching element is turned on, the intermediate potential node 23 receives the high potential VDD. On the other hand, when the semiconductor switching element 10a is turned on and the other semiconductor switching element is turned off, the intermediate potential node 23 receives the low potential GND. In other words, the high potential VDD or the low potential GND is supplied to the intermediate potential node 23 by turning on or turning off the semiconductor switching element. For example, the intermediate potential node 23 is connected to a load (not shown), and supplies the high potential VDD or the low potential GND to the load.

The semiconductor device 100A includes a drive circuit 150 for the semiconductor switching element 10a, a detection circuit 110 for detecting the inter-terminal voltage Vce of the semiconductor switching element 10a, and a voltage comparison circuit 130.

The driving circuit 150 receives a control signal SIN of the semiconductor switching element 10a, and outputs a gate signal SOUT to the gate (G) of the semiconductor switching element 10a based on the control signal SIN. For example, when the control signal SIN, which is a binary signal, is at a high level (hereinafter referred to as "H level"), if the gate signal SOUT is set to the H level, the semiconductor switching element 10a is turned on. The H level voltage of the gate signal SOUT is set greater than a threshold voltage of the IGBT constituting the semiconductor switching element 10a with respect to the negative electrode (emitter) of the semiconductor switching element 10a.

On the other hand, when the control signal SIN is at a low level (hereinafter referred to as "L level"), if the gate signal SOUT is set to the L level, the semiconductor switching element 10a is turned off. For example, the L level voltage of the gate signal SOUT is set equal to the voltage of the negative electrode (emitter) of the semiconductor switching element 10a, in other words, the low potential GND.

The detection circuit 110 includes a high breakdown voltage switch 120, a resistor element 121 and a resistor element 122 connected in series between the intermediate potential node 23 and the low potential node 22, in other words, between the positive electrode (collector) and the negative electrode (emitter) of the semiconductor switching element 10a. The high breakdown voltage switch 120 and the resistor element 121 are connected in series between the intermediate potential node 23, i.e., the collector (positive electrode) of the semiconductor switching element 10a and the node N1. The resistor element 122 is connected between the node N1 and the low potential node 22, i.e., the emitter (negative electrode) of the semiconductor switching element 10a.

The resistor element 121 has an electric resistance value R1, and the resistor element 122 has an electric resistance value R2. At least one of the resistor elements 121 and 122 is a variable resistor element. For example, both the electric resistance value R1 of the resistor element 121 and the electric resistance value R2 of the resistor element 122 may be adjusted by digital trimming.

The voltage comparison circuit 130 outputs a detection signal Sab in accordance with a comparison result between a voltage V+ of the positive input terminal and a voltage V− of the negative input terminal. The detection signal Sab is a digital signal that is set to the H level when V+>V−, and is set to the L level when V+≤V−.

The positive input terminal of the voltage comparison circuit 130 is connected to the node N1 of the detection circuit 110. In other words, the voltage V+ is equivalent to the voltage of the node N1. On the other hand, a voltage source 135 that supplies a DC voltage Vt is electrically connected between the negative input terminal of the voltage comparison circuit 130 and the low potential node 22 (the emitter of the semiconductor switching element 10a). It is preferable that the voltage source 135 is configured in such a manner that the DC voltage Vt is variable.

The high breakdown voltage switch 120 has a breakdown voltage greater than at least a potential difference between the high potential VDD and the low potential GND when the high breakdown voltage switch 120 is turned off. For example, the high breakdown voltage switch 120 may be configured to have a breakdown voltage equivalent to the breakdown voltage of the semiconductor switching element 10a. Typically, the high breakdown voltage switch 120 may be constituted by a transistor which is formed on the IC constituting the semiconductor device 100A and has the breakdown voltage mentioned above. The resistor elements 121 and 122 are also formed on the IC constituting the semiconductor device 100A.

The voltage comparison circuit 130 may be provided with any circuit configuration. For example, the voltage comparison circuit 130 may be mounted on the IC constituting the semiconductor device 100A by using a transistor, a resistor and the like formed on the IC constituting the semiconductor device 100A in the same way as the detection circuit 110.

On the other hand, the voltage source 135 may be disposed outside the semiconductor device 100A (IC). In this case, the DC voltage Vt is supplied from the outside of the semiconductor device 100A to a terminal (not shown) electrically connected to the negative input terminal of the voltage comparison circuit 130. Alternatively, a circuit that generates a constant voltage by reducing the high potential VDD using a transistor or the like on the semiconductor device 100A may be configured as the voltage source 135.

In the example configuration of FIG. 1, the high potential VDD corresponds to an embodiment of a "first potential", the low potential GND corresponds to an embodiment of a "second potential", the resistor element 121 corresponds to an embodiment of a "first resistor element", and the resistor element 122 corresponds to an embodiment of a "second resistor element". The node N1 corresponds to an embodiment of a "first node", and the DC voltage Vt corresponds to an embodiment of a "first DC voltage". In the first embodiment, the voltage comparison circuit 130 corresponds to an embodiment of a "detection voltage generation circuit", and the detection signal Sab corresponds to an embodiment of a "voltage signal".

As described in the above, it is known that when a switching element (IGBT) in the ON state encounters an overcurrent, the switching element is brought into a desaturation status in which the inter-terminal voltage Vce may not be sufficiently lowered even if the switching element is in the ON state. In the semiconductor device according to the present embodiment, the detection circuit 110 and the voltage comparison circuit 130 are configured to detect the desaturation status of the semiconductor switching element 10a (IGBT).

It is understandable from FIG. 1 that in the voltage comparison circuit 130, the voltage V+ of the positive input terminal may be expressed by the following expression (1):

$$V+ = (Vce - Va) \times R2/(R1+R2) \quad (1).$$

In the expression (1), Va represents a voltage applied to the high breakdown voltage switch 120. When the high breakdown voltage switch 120 is turned on, Va is substantially equal to 0. On the other hand, when the high breakdown voltage switch 120 is turned off, since the high breakdown voltage switch 120 blocks the inter-terminal voltage Vce, Va=Vce. Generally, Va is proportional to the inter-terminal voltage Vce.

When the high breakdown voltage switch 120 is turned off, V+=0, and thereby, the voltage comparison circuit 130 sets the detection signal Sab to the L level. On the other hand, when the high breakdown voltage switch 120 is turned on, V+=Vce×R2/(R1+R2). Therefore, when the inter-terminal voltage Vce is greater than a determination voltage Vth expressed by the following expression (2), the detection signal Sab is set to the H level. On the other hand, when the inter-terminal voltage Vce is equal to or less than the determination voltage Vth, the detection signal Sab is set to the L level. In other words, the DC voltage Vt, the first electric resistance value R1 and second electric resistance value R2 are determined in such a manner that when the inter-terminal voltage Vce is greater than the determination voltage Vth, V+>Vt.

$$Vth = Vtx(R1+R2)/R2 \quad (2)$$

Accordingly, the determination voltage Vth may be set in association with the inter-terminal voltage Vce when the desaturation status occurs (hereinafter, also referred to as "desaturation voltage"), based on the characteristics of the semiconductor switching element 10a. For example, by setting the determination voltage Vth to a voltage lower than the above-described desaturation voltage by a margin, the occurrence of the desaturation status may be detected when Vce>Vth and the detection signal Sab is changed to the H level during the ON period of the semiconductor switching element 10a.

Figure 2A:
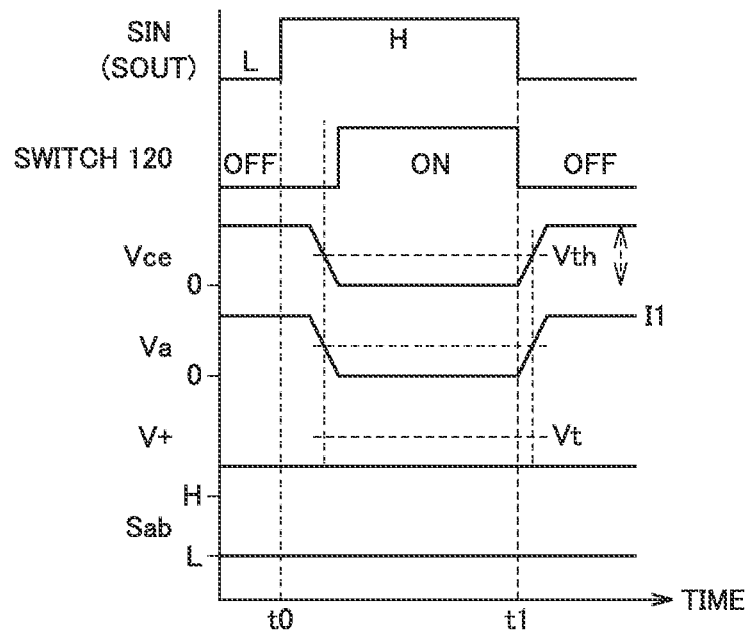
FIG. 2A is a waveform diagram illustrating operations of the semiconductor device according to the first embodiment when the semiconductor switching element is normal.
Figure 2B:
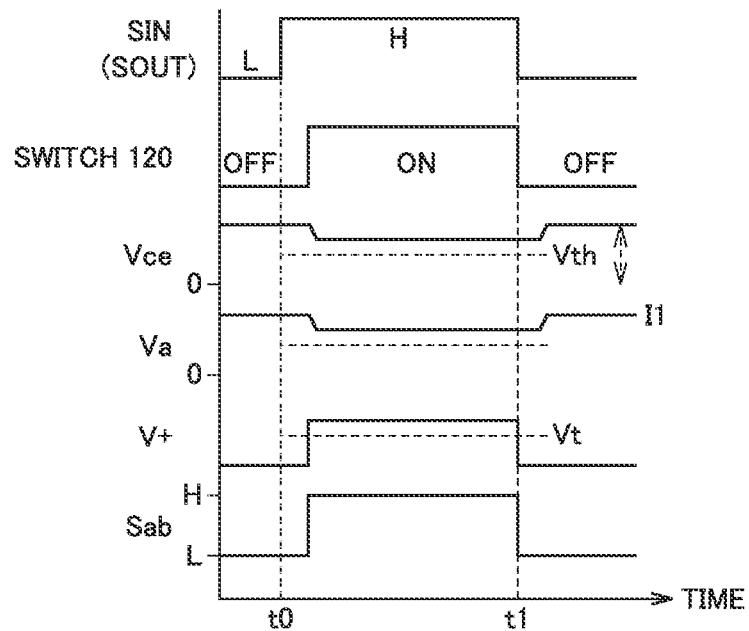
FIG. 2B is a waveform diagram illustrating operations of the semiconductor device according to the first embodiment when the semiconductor switching element is in a desaturation status.

FIGS. 2A and 2B illustrate example operations of the semiconductor device according to the first embodiment. FIG. 2A illustrates an example waveform diagram when the semiconductor switching element 10a operates normally.

With reference to FIG. 2A, before time t0, since the control signal SIN is set to the L level, the semiconductor switching element 10a is in the OFF state. At this time, generally the high potential VDD is applied to the intermediate potential node 23.

Since the high breakdown voltage switch 120 is turned off during the OFF period of the semiconductor switching element 10a, V=0 (GND) in the voltage comparison circuit 130, the detection signal Sab is set to the L level.

When the control signal SIN is changed from the L level to the H level at time to, the semiconductor switching element 10a is turned on. Specifically, the gate voltage of the semiconductor switching element 10a increases as the gate signal SOUT output from the driving circuit 150 is changed to the H level. Thus, the inter-terminal voltage Vce drops in the semiconductor switching element 10a, and a collector-emitter current begins to flow in the semiconductor switching element 10a. At time t1 when the control signal SIN is changed from the H level to the L level, the semiconductor switching element 10a is turned off.

If the semiconductor switching element 10a is in the normal ON state, no desaturation status occurs in the semiconductor switching element 10a, and thereby, the inter-terminal voltage Vce drops to a voltage near zero, and a normal collector-emitter current is generated. In other words, the inter-terminal voltage Vce becomes lower than the determination voltage Vth.

During the ON period of the semiconductor switching element 10a, a period for detecting the inter-terminal voltage Vce is provided by turning on the high breakdown voltage switch 120.

In the normal state illustrated in FIG. 2A, since the inter-terminal voltage Vce is close to 0 during the ON period of the high breakdown voltage switch 120, V+ is substantially equal to 0. Therefore, similar to the OFF period of the high breakdown voltage switch 120 described above, the detection signal Sab is maintained at the L level. Thus, in the normal ON state of the semiconductor switching element 10a (no occurrence of the desaturation status), the detection signal Sab is maintained at the L level during both the OFF period and the ON period of the high breakdown voltage switch 120.

FIG. 2B illustrates an example waveform diagram when a desaturation status occurs in the semiconductor switching element 10a.

Similarly to FIG. 2A, at time t0 when the control signal SIN is changed from the L level to the H level, the semiconductor switching element 10a is turned on. Similarly, at time t1 when the control signal SIN is changed from the H level to the L level, the semiconductor switching element 10a is turned off. Similarly to FIG. 2A, during the OFF period of the high breakdown voltage switch 120, since V+=0 (GND) in the voltage comparison circuit 130, the detection signal Sab is changed to the L level.

In FIG. 2B, when the semiconductor switching element 10a is turned on, the collector-emitter current becomes excessively large (overcurrent state), which causes the occurrence of a desaturation status. Therefore, a voltage abnormality occurs, and the inter-terminal voltage Vce does not drop to near 0 as illustrated in FIG. 2A, whereby Vce>Vth.

Therefore, during the ON period of the high breakdown voltage switch 120 provided as in FIG. 2A, since V+>Vt in the voltage comparison circuit 130, the detection signal Sab is changed from the L level to the H level. Thus, if a desaturation status occurs when the semiconductor switching element 10a is turned on, the detection signal Sab is set to the H level during the ON period of the high breakdown voltage switch 120.

Therefore, in the semiconductor device 100A according to the first embodiment, based on the detection signal Sab output from the voltage comparison circuit 130 during the ON period of the high breakdown voltage switch 120 which is provided within the ON period of the semiconductor switching element 10a, it is possible to detect the occurrence of a desaturation status accompanied by a voltage abnormality in the inter-terminal voltage.

When the semiconductor switching element 10a is turned off, the insulation of the detection circuit 110 between the intermediate potential node 23 to which the high potential Vcc is applied and the low potential node 22 may be ensured by the high breakdown voltage switch 120. In other words, it is possible to ensure the insulation of the detection circuit 110 by using an element (such as a high breakdown voltage field effect transistor) formed on the IC constituting the semiconductor device 100A including the driving circuit 150 instead of using the diode disclosed by WO 2017/104077, which makes it possible to prevent the circuit scale from increasing.

Further, since a constant current source which operates constantly is not provided as in WO 2017/104077, a constant current path is not formed inside the semiconductor device 100A including the detection circuit 110 during the OFF period of the high breakdown voltage switch 120. Therefore, it is possible to detect the occurrence of a desaturation status accompanied by a voltage abnormality in the inter-terminal voltage without increasing the power consumption.

In the semiconductor switching element 10a, the inter-terminal voltage Vce (desaturation voltage) generated by the desaturation status when a short-circuit path including the semiconductor switching element 10a is formed between the high potential node 21 and the low potential node 22 (during a so-called arm short-circuit) is different from the inter-terminal voltage Vce (desaturation voltage) generated by an overcurrent in the semiconductor switching element 10a which is caused by a short-circuit in the load to which the intermediate potential node 23 is connected (during a so-called load short-circuit). Generally, the inter-terminal voltage Vce during the load short-circuit is lower than that during the arm short-circuit.

Thus, in the semiconductor device 100A according to the first embodiment, the determination voltage Vth may be set variable by varying at least one of the DC voltage Vt of the voltage source 135, the electric resistance value R1 of the resistor element 121 and the electric resistance value R2 of the resistor element 122. Thus, it is possible to detect not only the occurrence of an arm short-circuit but also the occurrence of a load short-circuit by appropriately setting the determination voltage Vth. Alternatively, it is possible to detect and distinguish different desaturation status caused by different reasons by arranging a plurality of systems composed of the detection circuit 110 with a different determination voltage Vth and the voltage comparison circuit 130.

Figure 3:
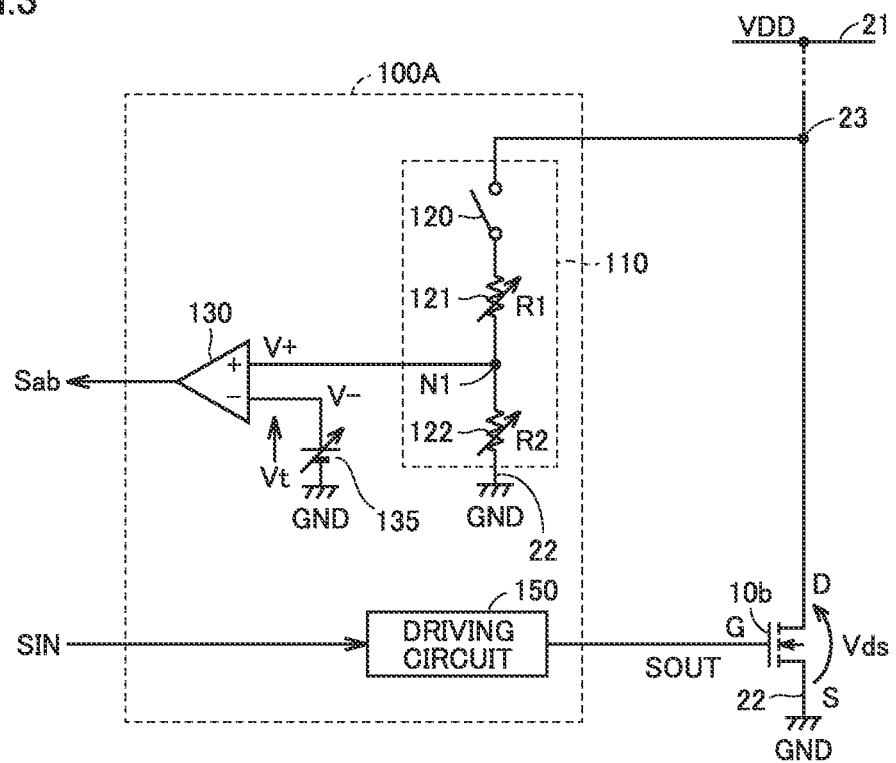
FIG. 3 is a second circuit diagram illustrating the configuration of the semiconductor device according to the first embodiment.

As illustrated in FIG. 3, the semiconductor device 100A according to the first embodiment may also be applied to the semiconductor switching element 10b made of MOSFET (Metal-Oxide-Semiconductor Field Effect Transistor Metal). The semiconductor switching element 10b may be an SiC-MOSFET made of SiC (silicon carbide).

The semiconductor switching element 10b includes a drain (D) corresponding to a "positive electrode", a source (S) corresponding to a "negative electrode", and a gate (G) corresponding to a "control electrode". A drain-source voltage Vds of the semiconductor switching element 10b corresponds to the "inter-terminal voltage".

The semiconductor device 100A may function as a driving IC to turn on and off the semiconductor switching element 10b in accordance with the control signal SIN, and may detect the occurrence of a desaturation status during the ON period of the semiconductor switching element 10b based on the detection signal Sab.

In the MOSFET, since the Ids-Vds characteristic between the source-drain current Ids and the drain-source voltage Vds is linear, an inter-terminal voltage proportional to an overcurrent generated in the semiconductor switching element 10b may be input to the detection circuit 110. As a result, when the semiconductor device 100A is applied to the semiconductor switching element 10b (MOSFET), it is easy to distinguish between the occurrence of an overcurrent (i.e., the desaturation status) and the non-occurrence of an overcurrent as compared with the case when the semiconductor device 100A is applied to the semiconductor switching element 10a, which makes it possible to more accurately detect the occurrence of the desaturation status.

Second Embodiment

Figure 4:
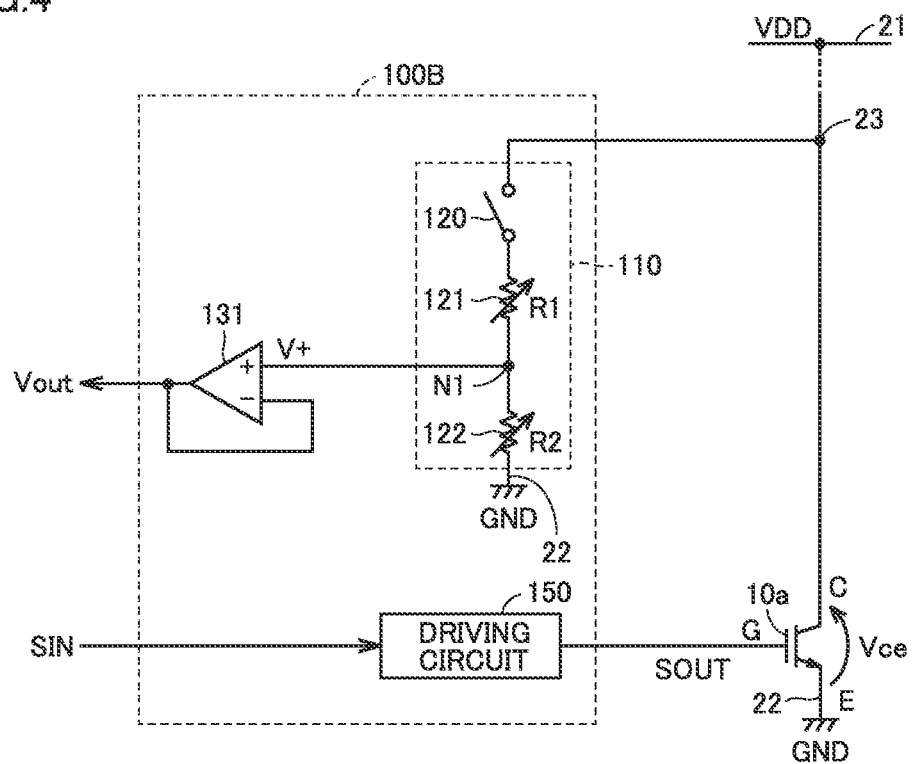
FIG. 4 is a first circuit diagram illustrating the configuration of a semiconductor device according to a second embodiment.

FIG. 4 is a first circuit diagram illustrating the configuration of a semiconductor device according to a second embodiment.

As illustrated in FIG. 4, a semiconductor device 100B according to the second embodiment, similar to the semiconductor device 100A illustrated in FIG. 1, functions as a driving IC for the semiconductor switching element 10a (IGBT). The semiconductor device 100B includes a detection circuit 110 and a drive circuit 150 similar to those in the semiconductor device 100A, and a voltage follower circuit 131.

Similar to the first embodiment, the positive input terminal of an operational amplifier constituting the voltage follower circuit 131 is connected to the node N1 of the detection circuit 110, and the negative input terminal and the output terminal of the operational amplifier are connected to each other. Accordingly, a voltage V+ of the positive input terminal, in other words, an analog voltage equivalent to the voltage of the node N1 is output from the voltage follower circuit 131 as an output voltage Vout.

In the second embodiment, the voltage follower circuit 131 corresponds to an embodiment of a "detection voltage generation circuit", and the output voltage Vout corresponds to an embodiment of a "voltage signal".

During the detection period of the inter-terminal voltage Vce after the high breakdown voltage switch 120 is turned on, the output voltage Vout is expressed by the following expression (3):

$$Vout = V+ = Vce \times R2/(R+R2) \quad (3).$$

Therefore, after the output voltage Vout is processed in a subsequent stage circuit (not shown), and if the output voltage Vout becomes greater than the determination voltage Vth described in the first embodiment, the occurrence of an overcurrent (desaturation status) may be detected. For example, the desaturation status (overcurrent) may be detected by a microcomputer or the like using a digital value obtained by A/D conversion of the output voltage Vout.

In particular, in the subsequent stage circuit, by comparing the output voltage Vout with a plurality of determination voltages Vth, it is possible to detect and distinguish different desaturation status caused by different reasons such as an overcurrent (desaturation status) caused by the arm short-circuit and an overcurrent (desaturation status) caused by the load short-circuit as described above.

Figure 5:
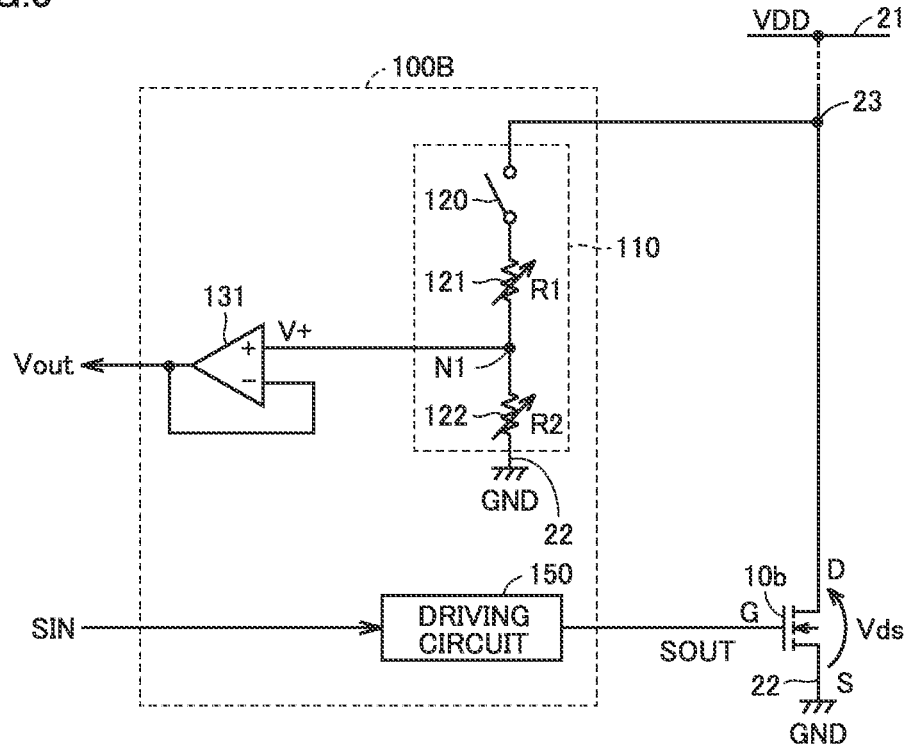
FIG. 5 is a second circuit diagram illustrating the configuration of the semiconductor device according to the second embodiment.

As illustrated in FIG. 5, the semiconductor device 100B according to the second embodiment may be applied to the semiconductor switching element 10b formed of MOSFET including an SiC-MOSFET similar to that illustrated in FIG. 3.

In other words, the semiconductor device 100B may function as a driving IC to turn on and off the semiconductor switching element 10b in accordance with the control signal SIN, and may generate an output voltage Vout for detecting the occurrence of the desaturation status during the ON period.

Due to the linearity of the Ids-Vds characteristic as described above, the semiconductor device 100B may generate the output voltage Vout proportional to the source-drain current Ids of the semiconductor switching element 10b, which makes it possible to more accurately detect the occurrence of a desaturation status (overcurrent).

In the first and second embodiments, since each of the semiconductor devices 100A and 100B has been described as a driving IC for the semiconductor switching elements 10a, the detection circuit 110 which detects a desaturation status based on an inter-terminal voltage and the voltage comparison circuit 130 or the voltage follower circuit 131 are mounted on the same IC with the driving circuit 150. However, the driving circuit 150 may be mounted on another IC (semiconductor device) different from the semiconductor device 100A or 100B including the detection circuit 110 and the voltage comparison circuit 130 or the voltage follower circuit 131.

Third Embodiment

In the third embodiment, the description will be given on the configuration of a semiconductor device that further includes a protection circuit which operates according to a detection result of a desaturation status of a semiconductor switching element.

Figure 6:
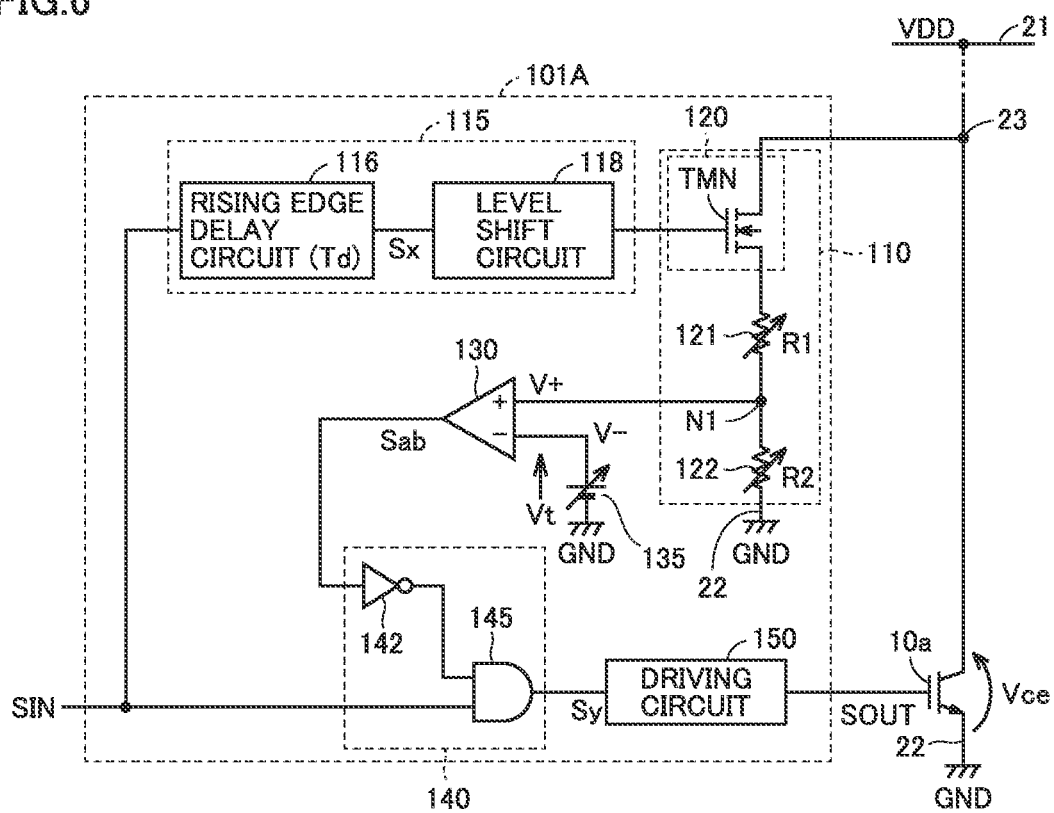
FIG. 6 is a circuit diagram illustrating the configuration of a semiconductor device according to a third embodiment.

FIG. 6 is a circuit diagram illustrating the configuration of a semiconductor device according to the third embodiment.

As illustrated in FIG. 6, a semiconductor device 101A according to the third embodiment further includes a switch control circuit 115 and a protection circuit 140 in addition to the detection circuit 110, the voltage comparison circuit 130, and the drive circuit 150, which are the same as those in the semiconductor device 100A (see FIG. 1).

The switch control circuit 115 generates a control signal Sx for turning on and off the high breakdown voltage switch 120 at the times described with reference to FIGS. 2A and 2B. The switch control circuit 115 includes a rising edge delay circuit 116 configured to add a delay time Td to the rising edge of the control signal SIN, and a level shift circuit 118. The rising edge delay circuit 116 may be constituted by, for example, a plurality of (an even number of) inverters (NOT gates) and AND gates.

In the example of FIG. 6, the high breakdown voltage switch 120 is constituted by a high breakdown voltage NMOS transistor TMN. The level shift circuit 118 converts the control signal Sx output from the rising edge delay circuit 116 into a gate signal having a voltage level capable of turning on and off the NMOS transistor TMN, and outputs the gate signal to the gate of the NMOS transistor TMN.

The protection circuit 140 includes an inverter (NOT gate) 142 and an AND gate 145. The inverter 142 outputs an inverted signal of the detection signal Sab from the voltage comparison circuit 130. The AND gate 145 outputs an AND operation result (a logical product) of the control signal SIN and the output signal of the inverter 142 as a control signal Sy.

The driving circuit 150 outputs a gate signal SOUT to the gate (G) of the semiconductor switching element 10a in accordance with the control signal Sy from the protection circuit 140. In other words, the gate signal SOUT is set to the H level during the H level period of the control signal Sy, and is set to the L level during the L level period of the control signal Sy.

Similar to the first embodiment, the detection circuit 110 and the voltage comparison circuit 130 changes the detection signal Sab from the L level to the H level when Vce>Vth during the ON period of the high breakdown voltage switch 120.

Figure 7A:
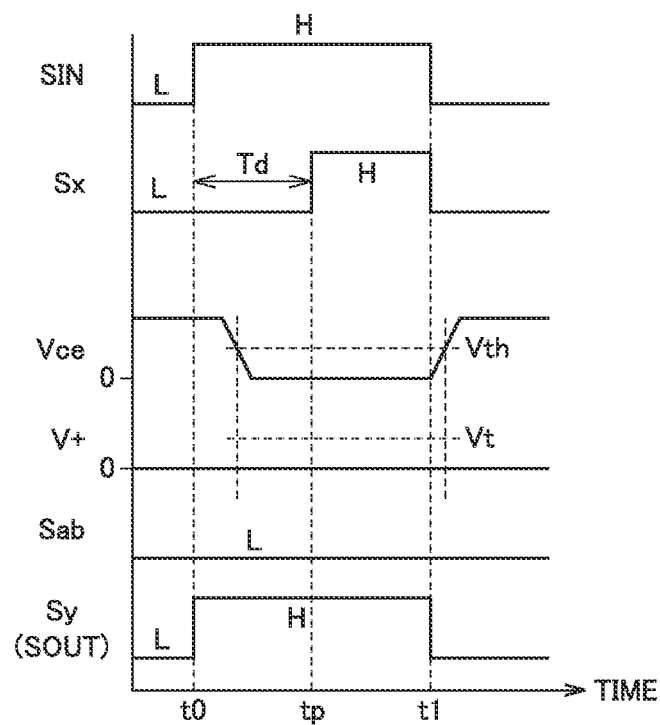
FIG. 7A is a waveform diagram illustrating operations of the semiconductor device according to the third embodiment when the semiconductor switching element is normal.
Figure 7B:
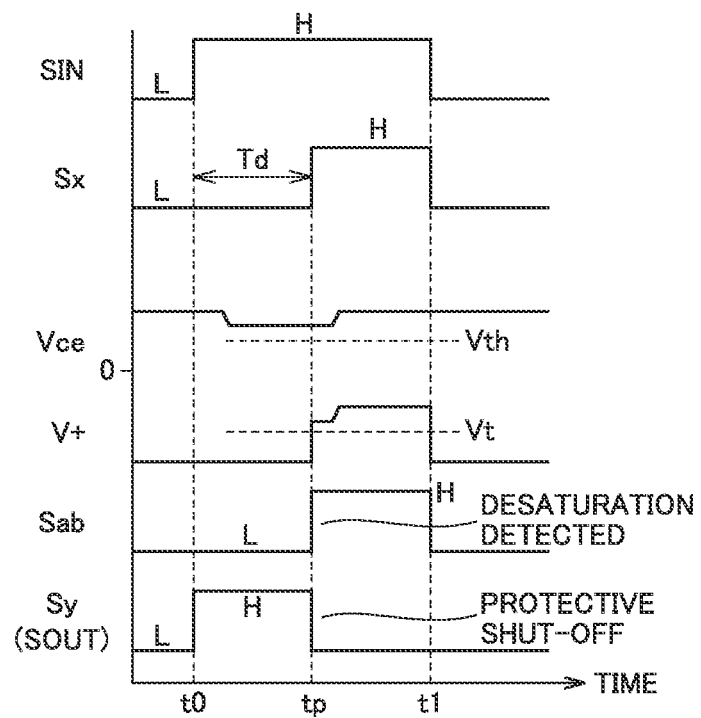
FIG. 7B is a waveform diagram illustrating operations of the semiconductor device according to the third embodiment when the semiconductor switching element is in a desaturation status.

FIGS. 7A and 7B illustrate example operations of the semiconductor device according to the third embodiment. FIG. 7A illustrates an example waveform diagram when the semiconductor switching element 10a operates normally, and FIG. 7B illustrates an example waveform diagram when a desaturation status occurs in the semiconductor switching element 10a.

As illustrated in FIG. 7A, during the normal operation, when the semiconductor switching element 10a is turned on in response to the change of the control signal SIN from the L level to the H level at time t0, the inter-terminal voltage Vce drops to near 0.

On the other hand, at time tp when the delay time Td added by the rising edge delay circuit 116 has elapsed from time t0, the control signal Sx is changed from the L level to the H level. During the H level period of the control signal Sx, the high breakdown voltage switch 120 is turned on, which enables a period for detecting the inter-terminal voltage Vce.

During the normal operation, since Vce<Vth during the ON period of the high breakdown voltage switch 120, then V+<Vt in the voltage comparison circuit 130, and as a result, the detection signal Sab is set to the L level in the same manner as in the OFF period of the high breakdown voltage switch 120 (the L level period of the control signal Sx). In other words, the detection signal Sab is maintained at the L level during both the L level period and the H level period of the control signal SIN.

Thus, in the protection circuit 140 illustrated in FIG. 6, the output signal of the inverter 142 is fixed to the H level, and thereby the control signal Sy output from the AND gate 145 has the same signal level as the control signal SIN. As a result, the gate signal SOUT input to the gate of the semiconductor switching element 10a is set in accordance with the control signal SIN.

Thus, when a desaturation status occurs as illustrated in FIG. 7B, the desaturation state occurs when the semiconductor switching element 10a is turned on as in FIG. 2B. Therefore, the inter-terminal voltage Vce does not drop to near 0, and a voltage abnormality in which Vce>Vth occurs.

As a result, since Vce>Vth at a time (time tp) when the high breakdown voltage switch 120 is turned on in response to the control signals SIN and Sx set in the same manner as in FIG. 7A, V+>Vt is satisfied in the voltage comparison circuit 130, and thereby the detection signal Sab is changed from the L level to the H level. Namely, the L level of the detection signal Sab corresponds to the "first level", and the H level corresponds to the "second level".

At this time, in the protection circuit 140, since the output signal of the inverter 142 is changed to the L level, the control signal Sy output from the AND gate 145 is also changed to the L level. In response, the gate signal SOUT is also changed to the L level, whereby the semiconductor switching element 10a is turned off. As a result, the semiconductor switching element 10a is automatically turned off, whereby the semiconductor switching element 10a may be protected from an overcurrent.

As described above, according to the semiconductor device of the third embodiment, in addition to the effect of the semiconductor device of the first embodiment, it is possible to realize a protection function so as to automatically shut off the switching element in response to the detection of a desaturation status.

Figure 8:
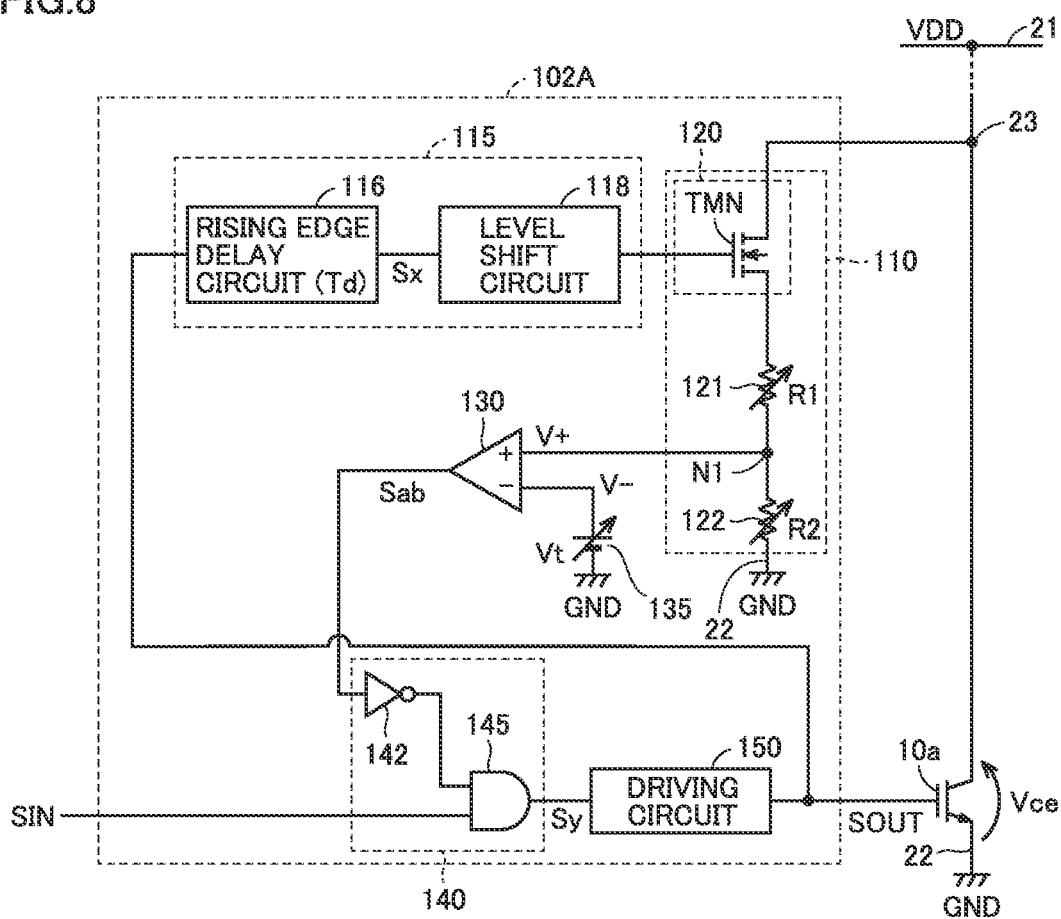
FIG. 8 is a circuit diagram illustrating the configuration of a first modification of the semiconductor device according to the third embodiment.

FIG. 8 shows a first modification of the semiconductor device according to the third embodiment.

As illustrated in FIG. 8, a semiconductor device 102A according to the first modification of the third embodiment differs from the semiconductor device 101A (FIG. 6) in that the gate signal SOUT output from the drive circuit 150 is input to the switch control circuit 115. The other configuration of the semiconductor device 102A is the same as that of the semiconductor device 101A, and the detailed description thereof will not be repeated.

In the semiconductor device 102A, during the L level period of the detection signal Sab, the signal level of the control signal SIN, the signal level of the control signal Sy, and the signal level of the gate signal SOUT are the same. Therefore, the control signal Sx for turning on and off the high breakdown voltage switch 120 is generated in the same manner as in FIGS. 7A and 7B.

When the detection signal Sab is changed to the H level, the control signal Sy and the gate signal SOUT are changed to the L level as in FIG. 7B, whereby the semiconductor switching element 10a is turned off. Therefore, the same protection function as the semiconductor device 101A may be realized by the semiconductor device 102A according to the first modification.

Figure 9:
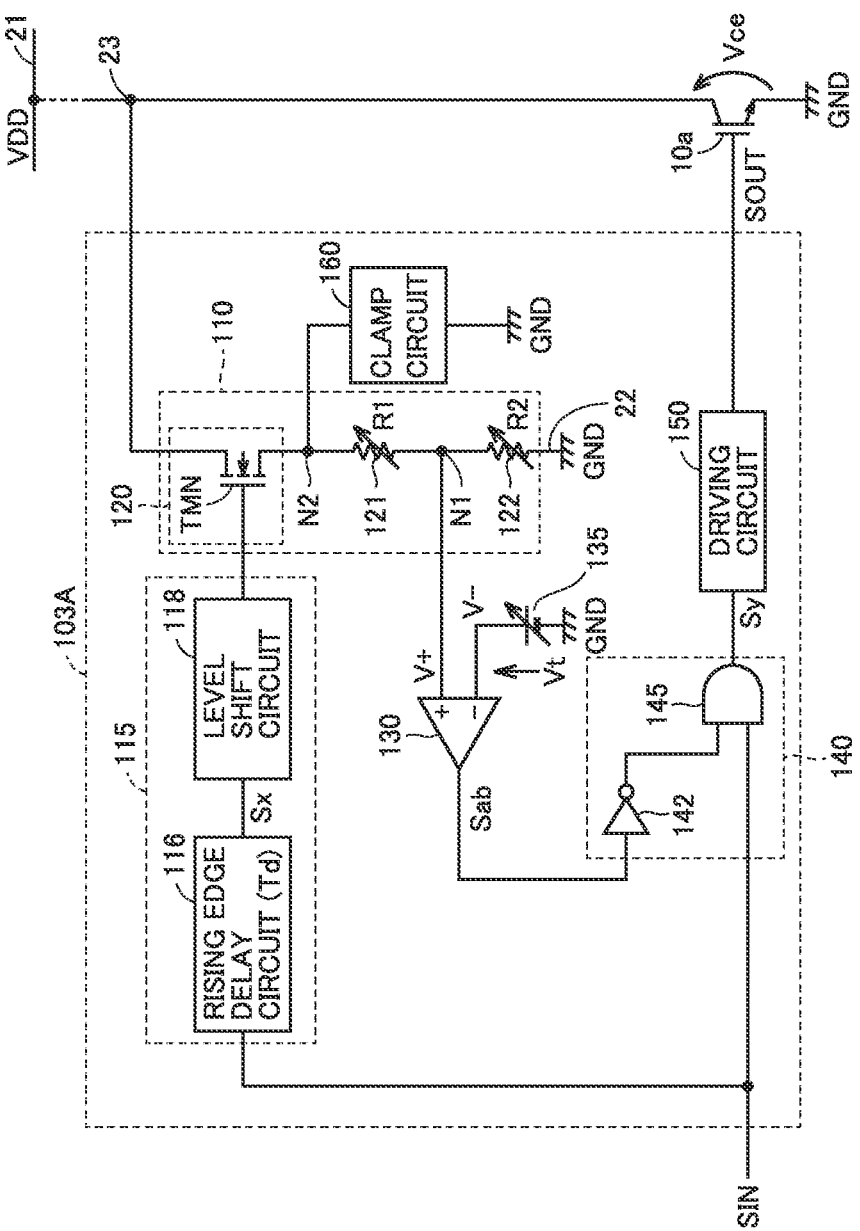
FIG. 9 is a circuit diagram illustrating the configuration of a second modification of the semiconductor device according to the third embodiment.

FIG. 9 shows a second modification of the semiconductor device according to the third embodiment.

As illustrated in FIG. 9, a semiconductor device 103A according to the second modification of the third embodiment further includes a clamp circuit 160 as compared with the semiconductor device 101A (FIG. 6). The other configuration of the semiconductor device 103A is the same as that of the semiconductor device 101A, and the detailed description thereof will not be repeated.

The clamp circuit 160 is connected to a node N2 to which the high breakdown voltage switch 120 and the resistor element 121 are connected. The clamp circuit 160 may be constituted by a diode (not shown) or the like which becomes conductive when a voltage greater than a predetermined upper limit voltage is applied to the node N2. In other words, the node N2 corresponds to the "second node".

Due to the disposition of the clamp circuit 160, it is possible to prevent a voltage greater than the upper limit voltage from being applied to the resistor elements 121 and 122 and the voltage comparison circuit 130. Thus, even if the resistor elements 121 and 122 and the voltage comparison circuit 130 are formed of a low breakdown voltage element, it is possible to prevent the resistor elements 121 and 122 and the voltage comparison circuit 130 from being damaged by the application of a high voltage.

The clamp circuit 160 may be disposed in the semiconductor device 100A (FIGS. 1 and 3), the semiconductor device 100B (FIGS. 4 and 5), and the semiconductor device 102A (FIG. 8). Similar to the semiconductor devices 100A, 100B or the like, each of the semiconductor devices 101A to 103A described in the third embodiment may also be used as the driving IC for the semiconductor switching element 10b made of MOSFET.

The protection circuit 140 and the switch control circuit 115 described in the third embodiment each may be a logic circuit such as a CMOS (Complementary Metal Oxide Semiconductor) logic circuit constituted by transistors formed on the IC constituting each of the semiconductor devices 100A and 101A. Thus, the protection circuit 140 and the switch control circuit 115 may be mounted on the same integrated circuit with the detection circuit 110, the voltage comparison circuit 130, and the driving circuit 150.

The switch control circuit 115 may be mounted on the semiconductor device 100A according to the first embodiment or the semiconductor device 100B according to the second embodiment. Alternatively, in the semiconductor device 100A or 100B, a signal corresponding to the control signal Sx may be input from the outside of the semiconductor device 100A or 100B.

Alternatively, in the semiconductor device 100A according to the first embodiment or the semiconductor device 100B according to the second embodiment, a function (circuit) equivalent to the protection circuit 140 may be provided outside the semiconductor device (IC), and a signal equivalent to the control signal Sy may be input to the driving circuit 150 from the outside of the semiconductor device 100A or 100B. In particular, since an analog voltage (output voltage Vout) output from the semiconductor device 100B is proportional to the inter-terminal voltage, the external protection circuit may distinguish, based on the magnitude of the inter-terminal voltage, the magnitude of the short-circuit current which varies in response to the cause of the arm short-circuit or the load short-circuit as described above. Thus, the protection function may be switched according to the magnitude of the short-circuit current.

For example, in the case of a large short-circuit current and a high inter-terminal voltage caused by an arm short-circuit or the like, it is preferable to immediately turn off the semiconductor switching element during an ON period as described in the third embodiment. On the other hand, when the short-circuit current and the inter-terminal voltage caused by a load short-circuit or the like are lower than those caused by an arm short-circuit, the semiconductor switching element may be suitably protected by preventing the semiconductor switching element from being forcibly shut off during the ON period but prohibiting the semiconductor switching element from being turned on next time.

Although the embodiments of the present disclosure have been described, it should be understood that the embodiments disclosed herein are illustrative and not restrictive in all respects. It is intended that the scope of the present disclosure is indicated by the claims, and includes all modifications within the meaning and range equivalent to the claims.

What is claimed is:

1. A semiconductor device comprising:
a detection circuit connected between a positive electrode and a negative electrode of a semiconductor switching element, the detection circuit including:
a switch and a first resistor element connected in series between the positive electrode and a first node, the first resistor element having a first electric resistance value; and
a second resistor element connected between the first node and the negative electrode, and the second resistor element having a second electric resistance value,
at least one of the first resistor element and the second resistor element being a variable resistor element,
the positive electrode being connected to a node that supplies a first potential via another semiconductor switching element, and the negative electrode being connected to a node that supplies a second potential lower than the first potential,
the semiconductor device further comprising:
a detection voltage generation circuit that, based on a voltage of the first node during an ON period of the switch provided within an ON period of the semiconductor switching element, outputs a voltage signal having a voltage dependent on an inter-terminal voltage between the positive electrode and the negative electrode, the voltage of the first node during the ON period of the switch being a divided voltage of the inter-terminal voltage between the positive electrode and the negative electrode of the semiconductor switching element during the ON period of the semiconductor switching element,
the switch having a breakdown voltage greater than at least a potential difference between the first potential and the second potential when the switch is turned off, wherein
the detection voltage generation circuit includes a voltage comparison circuit that outputs, as the voltage signal, a detection signal in digital form in accordance with a comparison result between a voltage of the first node and a first DC voltage,
the first DC voltage, the first electric resistance value, and the second electric resistance value are determined in such a manner that when the inter-terminal voltage becomes greater than a predetermined determination voltage, the voltage of the first node is greater than the first DC voltage, and
the determination voltage is set in association with the inter-terminal voltage when a desaturation status of the semiconductor switching element occurs.

2. The semiconductor device according to claim 1, wherein
the first DC voltage is supplied by a variable DC power supply.

3. The semiconductor device according to claim 1, wherein
the detection voltage generation circuit includes a voltage follower circuit that outputs an analog voltage in accordance with the voltage of the first node as the voltage signal.

4. The semiconductor device according to claim 1, wherein
the semiconductor device further comprises a switch control circuit that turns on the switch when the semiconductor switching device is turned on but at a timing later than the timing of turning on the semiconductor switching device, and
the switch is an NMOS transistor.

5. The semiconductor device according to claim 1, wherein
the switch and the first resistive element are connected in series via a second node between the positive electrode and the first node, and
the semiconductor device further comprises a clamp circuit that is connected to the second node and operates to prevent a voltage of the second node from exceeding a predetermined upper limit voltage.

6. The semiconductor device according to claim 1, wherein
the semiconductor switching element is a MOSFET.

7. The semiconductor device according to claim 1, wherein
the voltage comparison circuit is configured to compare a voltage of the first node with a first DC voltage to output, as the voltage signal, the detection signal in digital form.

8. A semiconductor device comprising:
a detection circuit connected between a positive electrode and a negative electrode of a semiconductor switching element,
the detection circuit including:
a switch and a first resistor element connected in series between the positive electrode and a first node, the first resistor element having a first electric resistance value; and
a second resistor element connected between the first node and the negative electrode, and the second resistor element having a second electric resistance value,
at least one of the first resistor element and the second resistor element being a variable resistor element,
the positive electrode being connected to a node that supplies a first potential via another semiconductor switching element, and the negative electrode being connected to a node that supplies a second potential lower than the first potential,
the semiconductor device further comprising:
a detection voltage generation circuit that, based on a voltage of the first node during an ON period of the switch provided within an ON period of the semiconductor switching element, outputs a voltage signal having a voltage dependent on an inter-terminal voltage between the positive electrode and the negative electrode,
the switch having a breakdown voltage greater than at least a potential difference between the first potential and the second potential when the switch is turned off,
the detection voltage generation circuit including a voltage comparison circuit that outputs, as the voltage signal, a detection signal in digital form in accordance with a comparison result between a voltage of the first node and a first DC voltage,
the first DC voltage, the first electric resistance value and the second electric resistance value being determined in such a manner that when the inter-terminal voltage becomes greater than a predetermined determination voltage, the voltage of the first node is greater than the first DC voltage,
the semiconductor device further includes:
a driving circuit that generates a gate signal to be input to a control electrode of the semiconductor switching element in accordance with a control signal for controlling ON/OFF of the semiconductor switching element; and
a protection circuit that turns off the semiconductor switching element in response to the detection signal, the detection signal being set to a first level during the OFF period of the switch and during the ON period of the switch when the inter-terminal voltage is equal to or lower than the determination voltage, and being set to a second level during the ON period of the switch when the inter-terminal voltage is greater than the determination voltage, and the protection circuit actuating the driving circuit to turn off the semiconductor switching element when the detection signal is set to the second level.

* * * * *